United States Patent

Chu et al.

[11] Patent Number: 6,154,397
[45] Date of Patent: Nov. 28, 2000

[54] SEMICONDUCTOR MEMORY DEVICE HAVING STABILIZATION CIRCUIT FOR STABLE SIGNAL TRANSMISSION

[75] Inventors: Shin-Ho Chu; Je-Hun Ryu, both of Ichon, Rep. of Korea

[73] Assignee: Hyundai Electronics Industries Co., Ltd., Rep. of Korea

[21] Appl. No.: 09/471,518

[22] Filed: Dec. 23, 1999

[30] Foreign Application Priority Data

Dec. 24, 1998 [KR] Rep. of Korea ..................... 98-58598

[51] Int. Cl.⁷ .................................................. G11C 7/00
[52] U.S. Cl. .................... 365/198; 365/189.11; 365/203; 326/86
[58] Field of Search ................................. 365/198, 194, 365/189.11, 191, 189.01, 203; 326/86, 84

[56] References Cited

U.S. PATENT DOCUMENTS

| | | | |
|---|---|---|---|
| 5,311,471 | 5/1994 | Matsumoto et al. | 365/189.05 |
| 5,416,743 | 5/1995 | Allan et al. | 365/203 |
| 5,625,592 | 4/1997 | Shinozaki | 365/189.01 |
| 5,654,927 | 8/1997 | Lee | 365/203 |
| 5,715,210 | 2/1998 | Yoo et al. | 365/230.06 |
| 5,742,185 | 4/1998 | Lee | 326/86 |

*Primary Examiner*—David Nelms
*Assistant Examiner*—Hoai V. Ho
*Attorney, Agent, or Firm*—Blakely Sokoloff Taylor & Zafman

[57] ABSTRACT

A semiconductor memory device includes a transmission line, connected to a driving unit, for transmitting a signal from the driving unit, a delaying unit for delaying a level of the transmission line to output the delayed signal, a pre-charging unit for receiving the delayed signal to precharge the transmission line, and a stabilization unit for accelerating the level transition of the transmission line, wherein the stabilization unit includes a detecting unit for detecting the level of the transmission line transmitted from the driving unit to generate a detected signal, and a switching unit for performing a switching operation in response to the detected level to swiftly achieve a level transition of the transmission line.

6 Claims, 6 Drawing Sheets

SEMICONDUCTOR MEMORY DEVICE HAVING STABILIZATION CIRCUIT FOR STABLE SIGNAL TRANSMISSION

FIELD OF THE INVENTION

The present invention relates to a semiconductor memory device; and, more particularly, to a semiconductor memory device having a stabilization circuit for a stable signal transmission.

DESCRIPTION OF THE PRIOR ART

Generally, a precharge circuit and a delay unit are widely used for a stable signal transmission through a long data bus line, wherein the precharge circuit includes two PMOS transistors and a repeater with two serial-connected inverters. The precharge circuit precharges the data bus line in response to a delayed signal from the delay unit so as to transmit a next data signal.

FIG. 1 shows a conventional data bus line with a precharge unit. Referring to FIG. 1, a first data bus line DB and a second data bus line /DB are connected between driving units 1 and 2. Typically, a transmitted signal level may be dropped down due to loads, such as active loads and LC loads, existing on the first and second data bus lines DB and /DB. A first precharge unit 12 for precharging the first data bus line DB includes a repeater 10 and two PMOS transistors P1 and P2, incorporating a form of feedback loop. One PMOS transistor P2 is turned on in response to a delayed signal transmitted through the delay unit 7 to thereby precharge the first data bus line DB. The other PMOS transistor P1 has a gate coupled to a ground voltage level, maintaining a turned-on state. Therefore, the first data bus line DB maintains a high voltage level at normal mode.

The second data bus line /DB is also applied in the same manner as the first data bus line DB.

At a read operation mode or a write operation mode, the driving units 1 and 2 operates and a level of one of the data bus lines DB and /DB changes to a low voltage level. If a level of the first data bus line DB changes to a low voltage level, a level at a node $N_a$ changes to a low voltage level. After a predetermined delay due to the delay unit 7, the PMOS transistor P2 is turned on, resulting in a precharge of the first data bus line DB.

In case where the precharge unit is used, the level transition time is excellent, but a transmission delay caused by the repeater is inevitable. In addition, if the data bus line is a bi-directional data bus line which can be used as a bus line at both read mode and write mode, a flag determining whether a current operation is at a read operation mode or a write operation mode should be used as a control signal. If the data bus line is used in common by banks, a bank information should be also used as a control signal for preventing data conflict. In that case, a circuit for a signal transmission becomes complicated and a chip size is also increased, so that a degree of integration is decreased.

SUMMARY OF THE INVENTION

It is, therefore, an object of the present invention to provide a semiconductor memory device having a stabilization circuit for a stable signal transmission.

In accordance with an embodiment of the present invention, there is provided a semiconductor memory device, comprising: a transmission line, connected to a driving unit, for transmitting a signal from the driving unit; a delaying means for delaying a level of the transmission line to output the delayed signal; a precharging means for receiving the delayed signal to precharge the transmission line; and a stabilization means for accelerating the level transition of the transmission line, including: a detecting means for detecting the level of the transmission line transmitted from the driving unit to generate a detected signal; and a switching means for performing a switching operation in response to the detected level to swiftly achieve a level transition of the transmission line.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 2:
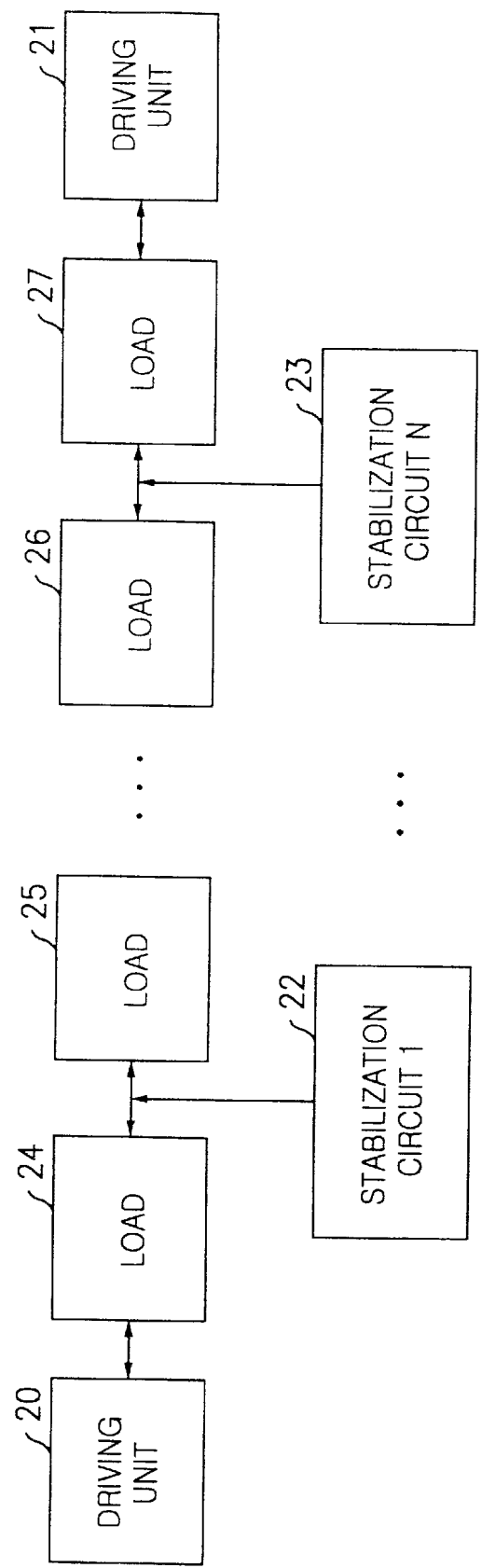
FIG. 2 is a block diagram illustrating a data bus line in accordance with the present invention.

Referring to FIG. 2, a data bus line having loads 24 to 27 is connected between driving units 20 and 21. A plurality of stabilization circuits 22 and 23 are connected to the data bus line to thereby obtain a stable signal transmission.

Figure 3:
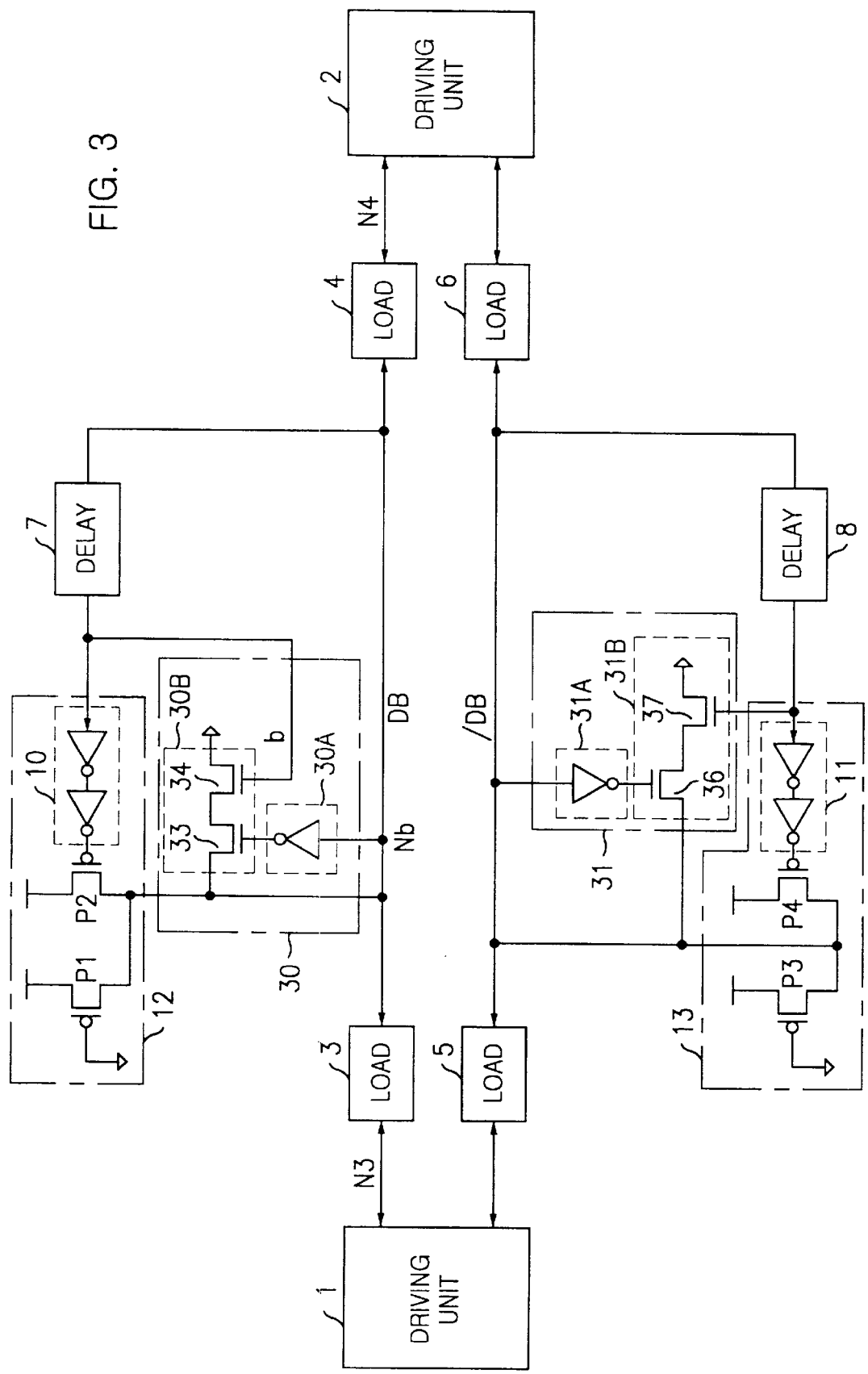
FIG. 3 is a schematic diagram illustrating a bus line having a stabilization circuit according to an embodiment of the present invention.

Referring to FIG. 3, first and second data bus lines DB and /DB as a transmission line are connected between the driving units 1 and 2 so as to communicate a signal therebetween. Loads 3 to 6 typically exist on the data bus lines DB and /DB. Delay units 7 and 8, precharging units 12 and 13, and stabilization units 30 and 31 are connected to the first and second data bus lines DB and /DB, respectively.

The first precharge unit 12 includes two-serial connected inverters for receiving the output signal of the delay unit 7 and two PMOS transistors P1 and P2. The PMOS transistor P1 has a source connected to a power supply voltage level, a drain connected to the first data bus line DB and a gate connected to a ground voltage level. The PMOS transistor P2 has a source connected to the power supply voltage level, a drain connected to the first data bus line GL and a gate receiving an output signal of the two serial-connected inverters 10.

The first stabilization unit 30 includes a first detecting unit 30A for detecting the level of the first data bus line DB to generate a detected signal, and a first switching unit 30B for performing a switching operation in response to the detected level to swiftly achieve a level transition of the first data bus line DB.

The first detecting unit 30A according to an embodiment of the present invention is implemented with an inverter.

The first switching unit 30B includes two NMOS transistors 33 and 34, serially connected to each other between the ground voltage level and the first data bus line DB. The first NMOS transistor 33 has a gate receiving an output signal of the first detecting unit 30A, one of whose terminals are connected to the first data bus line DB. The second NMOS transistor 34, connected between the first NMOS transistor 33 and the ground voltage level, has a gate receiving an output signal of the delay unit 7.

The second stabilization unit 31 has the same circuit configuration as the first stabilization unit 30.

An operation of the stable signal transmission will be described with reference with FIG. 3.

At a normal operation, the first and second data bus lines DB and /DB are precharged to a high level by the precharge units 12 and 13, so that a level at a node $N_b$ is high. Accordingly, the first NMOS transistor 33 maintains a turned-off state in response to an inverted signal from the inverter 32. Also, the second NMOS transistor 34 maintains a turned-on state in response to a delayed signal from the delay unit 7.

At a read or write operation, either the driving unit 1 or the driving unit 2 operates to set one of the data bus lines DB and /DB to a low level. For example, if the first data bus line DB is low, the level at a node $N_b$ is low. On the way of becoming low at the node $N_b$, the inverter 32 reaches to a threshold voltage to generate a high level and the first NMOS transistor 33 is turned on in response to the high level from the inverter 32. As a result, the level at $N_b$ is swiftly set to a low level. At this time, the second NMOS transistor 34 is in the turned-on state since the output of the delay unit 7 is the high level during a predetermined period. Then, after a predetermined period, the first precharge unit 12 again precharges the node $N_b$ in response to the low level from the delay unit 7.

At this time, since the precharge unit 12 includes a repeater 10 with two serial-connected inverters, the second NMOS transistor 34 is turned off before the precharge unit 10 operates. Accordingly, a leakage current flowing from the power supply to the ground is prevented. An operation of the second data bus line /DB is the same as that of the first data bus line DB.

Figure 4:
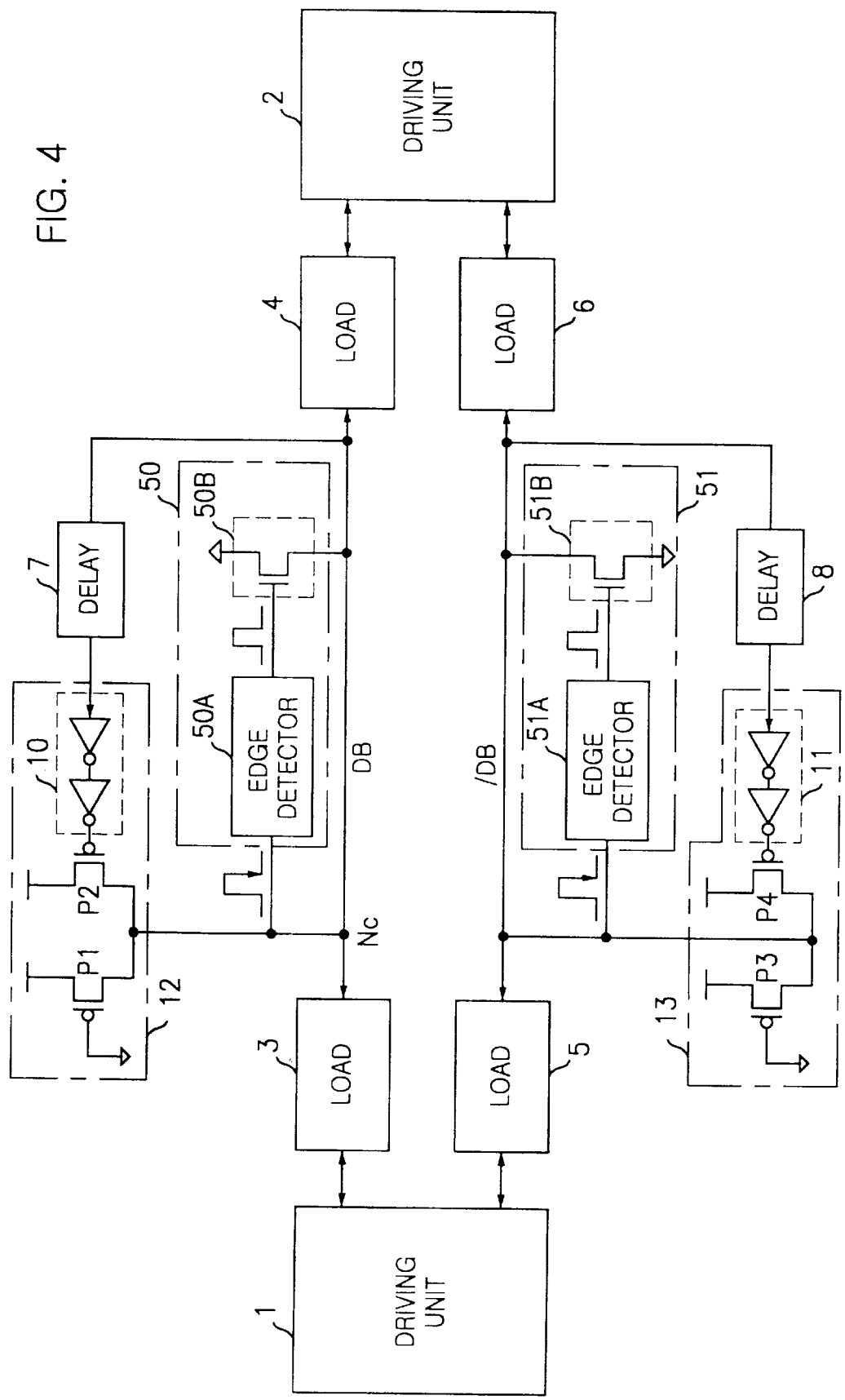
FIG. 4 is a schematic diagram illustrating a data bus line having a stabilization circuit according to another embodiment of the present invention.

FIG. 4 is a schematic diagram illustrating a data bus line for a stable signal transmission according to another embodiment of the present invention. As shown in FIG. 4, stabilization units 50 and 51 include edge detectors 50A and 51A connected to the first and second data bus line DB and /DB, and NMOS transistors 50B and 51B, respectively. The NMOS transistor 50B is connected between the ground and the first data bus line DB, whose gate receives an output signal of the edge detector 50A. The NMOS transistor 51B is connected between the ground and the second data bus line /DB, whose gate receives an output signal of the edge detector 51B.

At a normal operation, the first and second data bus lines DB and /DB are precharged to a high level by the precharge units 12 and 13, so that a level at a node $N_c$ is high.

At a read or write operation, one of the first and second data bus lines DB and /DB is set to a low level. For example, if the first data bus line DB is low, the level at the node $N_c$ is low. On the way of becoming low at the node $N_c$, an edge detector 50A detects the level transition of the first data bus line DB to generate a pulse signal. Then, the first NMOS transistor 50B is turned on in response to the pulse signal. Due to the switching operation of the first NMOS transistor 50B, the level of the first data bus line DB is swiftly set to a low level. Then, the precharge unit 12 again precharges the first data bus line DB to a high level. In such a case, the pulse width should be controlled so that the NMOS transistor 50B can be turned off before the precharge unit 12 precharges the first data bus line DB.

Figure 1:
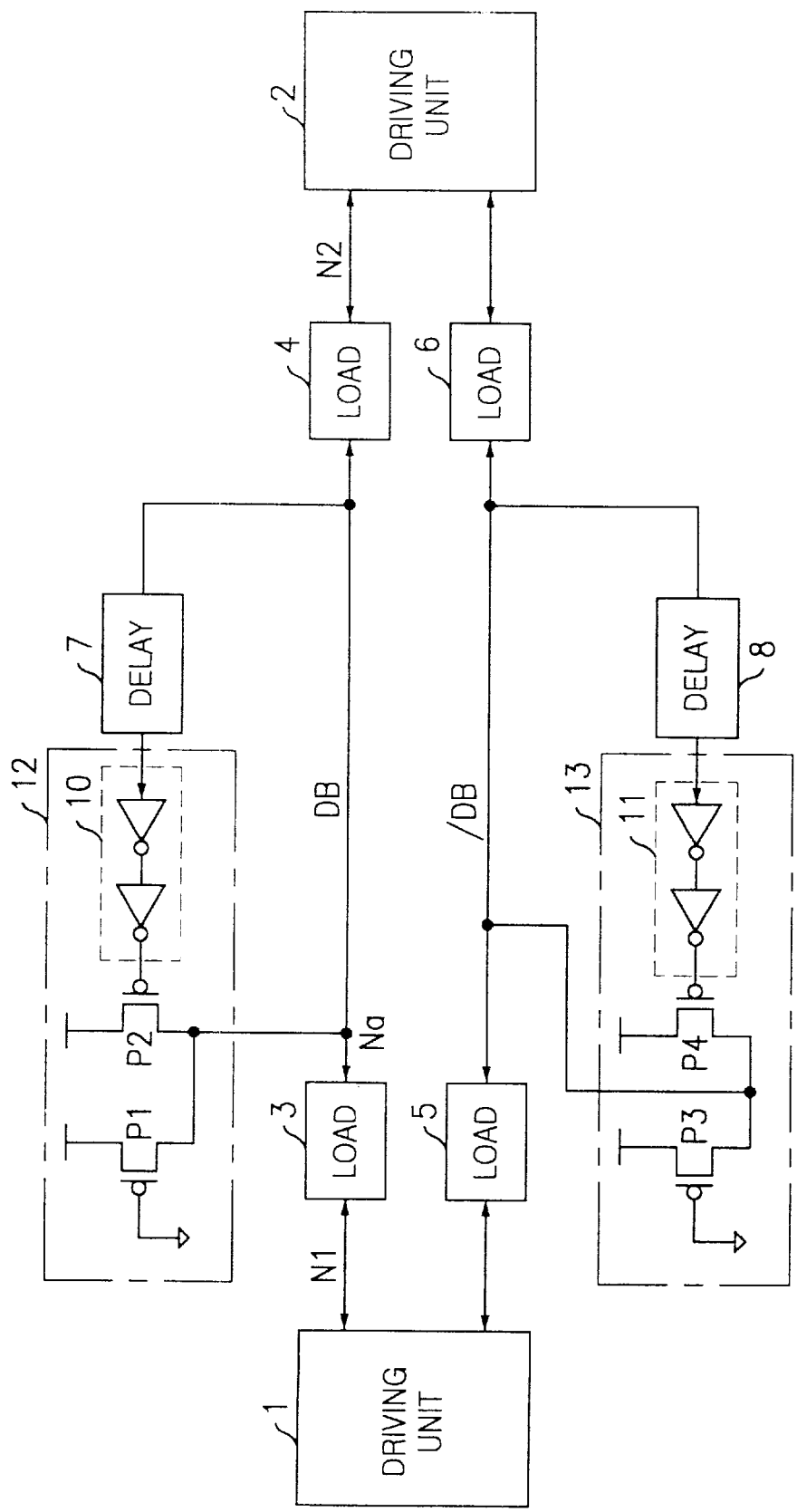
FIG. 1 is a schematic diagram showing a conventional data bus line.
Figure 5:
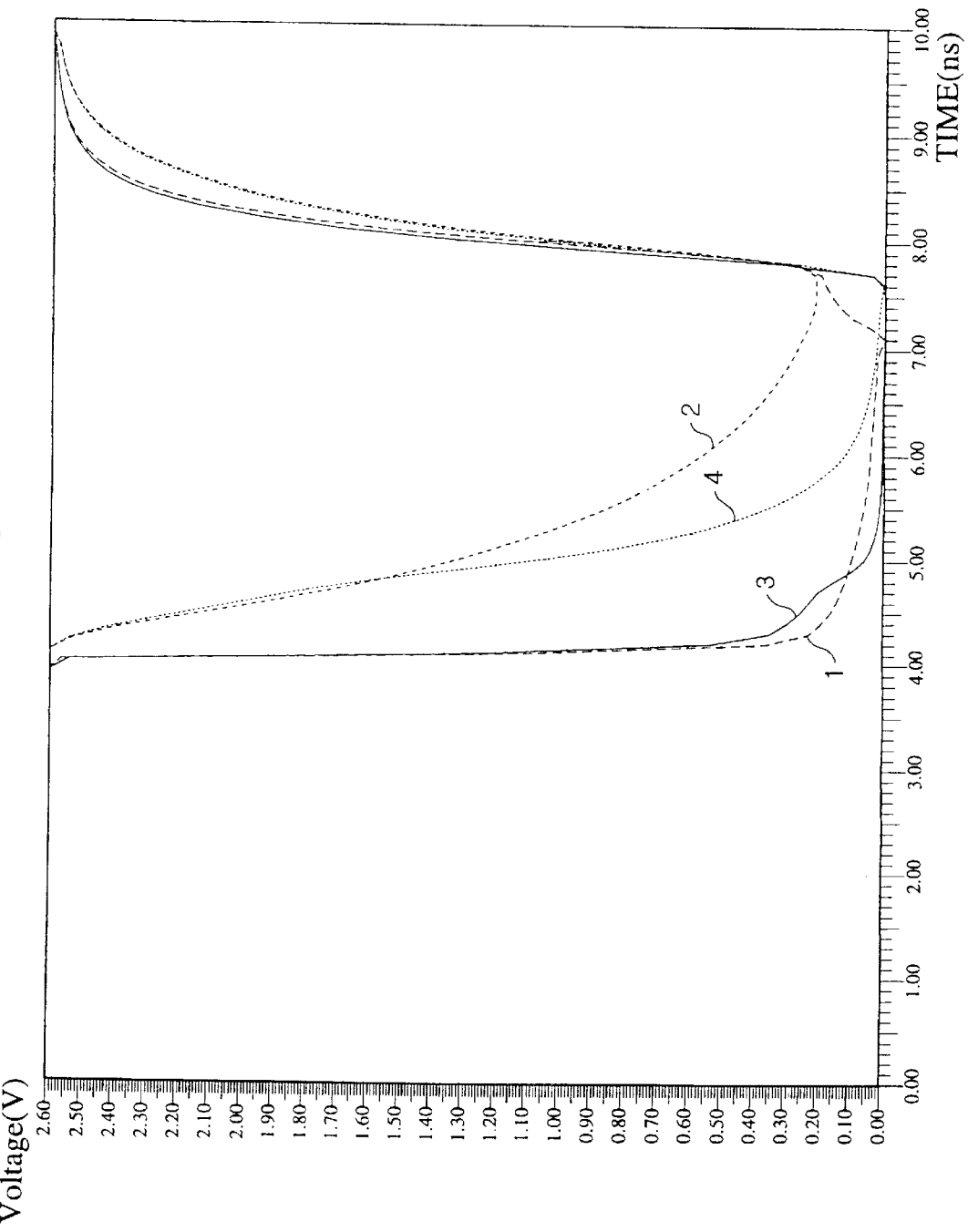
FIGS. 5 and 6 are graphs illustrating a signal transmission characteristic.

FIG. 5 is a graph illustrating a signal transmission characteristic when the data bus line is 15,000 µm in length. Reference numerals 1 and 2 indicate the conventional signal transmission at the node N1 and the node N2 in FIG. 1, respectively. Reference numerals 3 and 4 indicate the signal transmission at the node N3 and the node N4 in FIG. 3 having one stabilization unit, respectively. As can be seen, a degree of the signal transition is improved by about 1.5 ns.

Figure 6:
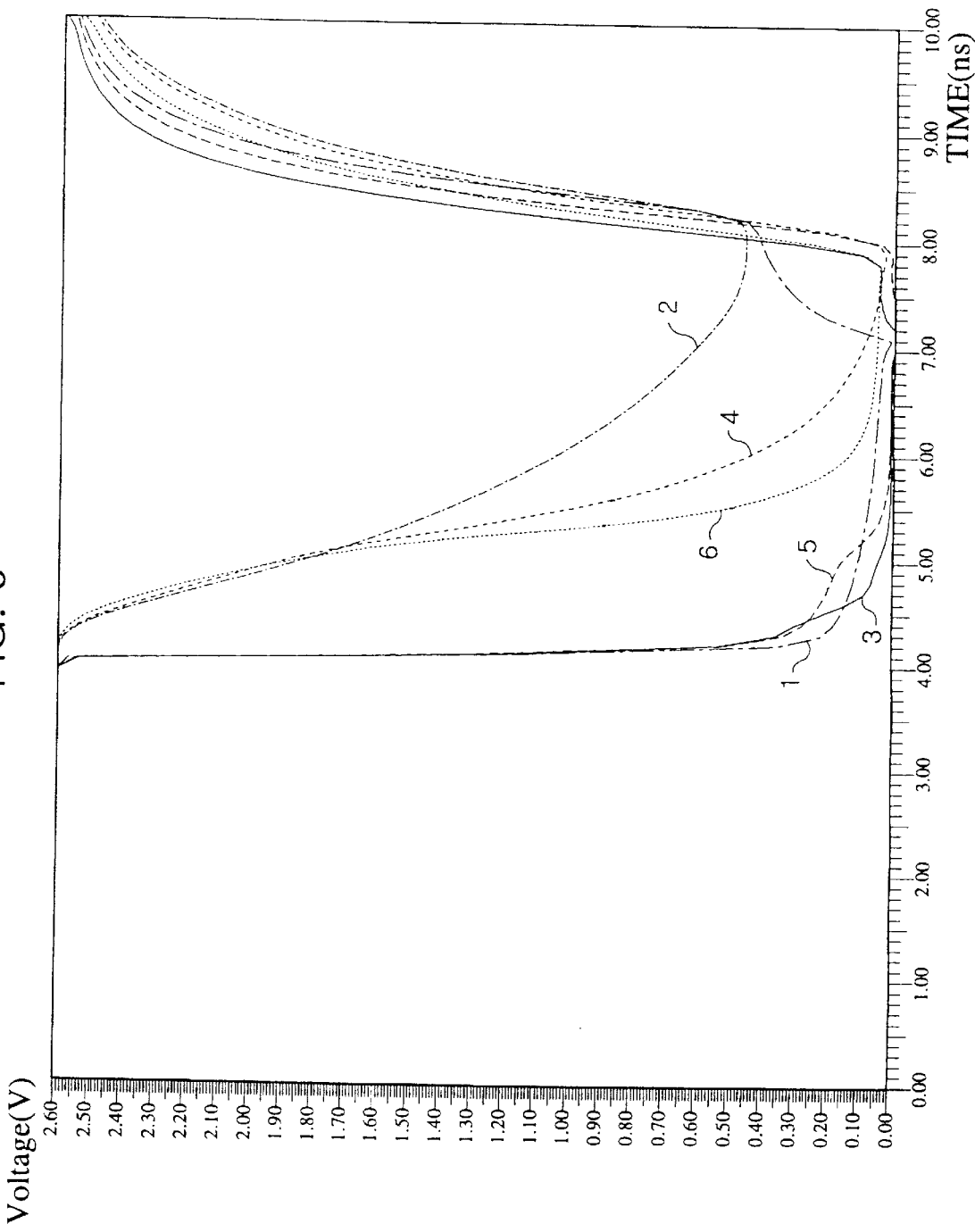

FIG. 6 is a graph illustrating a signal transmission characteristic when the data bus line is 20,000 µm in length. Reference numerals 1 and 2 indicate the conventional signal transmission at the node N1 and the node N2 in FIG. 1, respectively. Reference numerals 3 and 4 indicate a signal transmission at the node N3 and the node N4 in FIG. 3 in case where the one stabilization unit is connected to the data bus line, respectively. Further, reference numerals 5 and 6 indicate a signal transmission at the node N3 and the node N4 in FIG. 3 in case where the three stabilization units are connected to the data bus line, respectively. As can be seen, as the number of the stabilization unit becomes increasing, the characteristic of the level transition in the data bus line becomes increasingly improved.

By adding the stabilization circuits, the level of the data bus line can be swiftly set to the low level, so that a high speed of operation is obtained through a reduction of pulse width and a power consumption is effectively reduced by preventing a leakage current.

While the present invention has been described with respect to certain preferred embodiments only, other modifications and variation may be made without departing from the spirit and scope of the present invention as set forth in the following claims.

What is claimed is:

1. A semiconductor memory device, comprising:
    a transmission line, connected to a driving unit, for transmitting a signal from the driving unit;
    a delaying means for delaying a level of the transmission line to output the delayed signal;
    a precharging means for receiving the delayed signal to precharge the transmission line; and
    a stabilization means for accelerating the level transition of the transmission line, including:
        a detecting means for detecting the level of the transmission line transmitted from the driving unit to generate a detected signal; and
        a switching means for performing a switching operation in response to the detected level to swiftly achieve a level transition of the transmission line.

2. The semiconductor memory device as recited in claim 1, wherein the detecting means is an inverter connected between the transmission line and the switching means.

3. The semiconductor memory device as recited in claim 2, wherein the switching means includes:
    a first NMOS transistor having one terminal connected to the transmission line and a gate receiving the detected signal; and
    a second NMOS transistor, connected between the other terminal of the first NMOS transistor and the ground voltage level, whose gate receives the delayed signal from the delaying means.

4. The semiconductor memory device as recited in claim 3, wherein said precharging means includes:
    a plurality of serial-connected inverters for receiving the delayed signal from the delaying means; a first PMOS transistor having a source connected to the power supply voltage level, a drain connected to the transmission line and a gate receiving an output signal of said two serial-connected inverters; and a second PMOS transistor having a source connected to the power supply voltage level, a drain connected to the transmission line and a gate connected to the ground voltage level.

5. The semiconductor memory device as recited in claim 1, wherein the detecting means is an edge detector for detecting a level transition of the transmission line to output a pulse signal with a predetermined pulse width.

6. The semiconductor memory device as recited in claim 5, wherein the switching means is an NMOS transistor, connected between a ground voltage level and the transmission line, whose gate receives an output signal of the edge detector.

* * * * *